(12) United States Patent
Zhou et al.

(10) Patent No.: US 8,724,423 B1
(45) Date of Patent: May 13, 2014

(54) SYNCHRONOUS TWO-PORT READ, TWO-PORT WRITE MEMORY EMULATOR

(71) Applicant: LSI Corporation, Milpitas, CA (US)

(72) Inventors: Ting Zhou, Orinda, CA (US); Sheng Liu, Cupertino, CA (US)

(73) Assignee: LSI Corporation, San Jose, CA (US)

( * ) Notice: Subject to any disclaimer, the term of this patent is extended or adjusted under 35 U.S.C. 154(b) by 29 days.

(21) Appl. No.: 13/712,782

(22) Filed: Dec. 12, 2012

(51) Int. Cl.
| | | |
|---|---|---|
| *G11C 7/00* | (2006.01) | |
| *G11C 7/10* | (2006.01) | |
| *G11C 7/22* | (2006.01) | |
| *G11C 8/16* | (2006.01) | |
| *G06F 12/00* | (2006.01) | |
| *G06F 13/00* | (2006.01) | |
| *G11C 11/412* | (2006.01) | |
| *G11C 11/413* | (2006.01) | |
| *G06F 9/38* | (2006.01) | |
| *G06F 11/20* | (2006.01) | |

(52) U.S. Cl.
CPC ............... *G11C 8/16* (2013.01); *G11C 11/412* (2013.01); *G11C 7/1075* (2013.01); *G11C 11/413* (2013.01); *G11C 7/22* (2013.01); *G06F 9/3834* (2013.01); *G06F 11/2094* (2013.01)
USPC ............ 365/230.05; 365/189.02; 365/189.04; 365/233.16; 365/233.17; 365/233.19; 711/150; 711/206; 711/210

(58) Field of Classification Search
CPC ...... G11C 8/16; G11C 11/412; G11C 7/1075; G11C 11/413; G11C 7/22; G11C 13/0069; G06F 9/3834; G06F 11/2094
USPC ............. 365/189.02, 189.04, 230.05, 233.19, 365/233.16, 233.17; 711/206, 210
See application file for complete search history.

(56) References Cited

U.S. PATENT DOCUMENTS

| | | | |
|---|---|---|---|
| 4,985,848 A * | 1/1991 | Pfeiffer et al. ................ 345/505 |
| 6,189,073 B1 | 2/2001 | Pawlowski | |
| 6,882,562 B2 | 4/2005 | Beucler | |
| 7,333,381 B2 | 2/2008 | Rosen | |
| 7,461,191 B2 | 12/2008 | Baer et al. | |
| 7,533,222 B2 | 5/2009 | Leung | |
| 7,903,497 B2 | 3/2011 | Terzioglu et al. | |
| 2007/0183241 A1 | 8/2007 | Batra | |
| 2008/0229062 A1 * | 9/2008 | Gregorio ........................ 712/30 |
| 2011/0022791 A1 * | 1/2011 | Iyer et al. ...................... 711/105 |
| 2014/0047197 A1 * | 2/2014 | Kokrady et al. .............. 711/149 |

OTHER PUBLICATIONS

Ronald L. Rivest and Lance A. Glasser, "A Fast Multiport Memory Based on Single-Port Memory Cells," Jul. 1991, pp. 1-12, MIT Laboratory for Computer Science, Cambridge, MA.

* cited by examiner

*Primary Examiner* — Ly D Pham
(74) *Attorney, Agent, or Firm* — Otterstedt, Ellenbogen & Kammer, LLP

(57) ABSTRACT

A memory operative to provide concurrent two-port read and two-port write access functionality includes a memory array comprising first and second pluralities of single-port memory cells organized into a plurality of rows of memory banks, and multiple checksum modules. The second plurality of memory cells are operative as spare memory banks. Each of the checksum modules is associated with a corresponding one of the rows of memory banks. The memory further includes a first controller and multiple mapping tables. The first controller and at least a portion of the first and second pluralities of memory cells enable the memory array to support two-port read or single-port write operations. A second controller is operative to receive read and write access requests, and to map logical and spare memory bank identifiers to corresponding physical memory bank identifiers via the mapping tables to thereby emulate concurrent two-port read and two-port write access functionality.

20 Claims, 2 Drawing Sheets

SYNCHRONOUS TWO-PORT READ, TWO-PORT WRITE MEMORY EMULATOR

BACKGROUND

Multi-port memories are widely used in electronic applications in which high-speed data transfer is critical, including, but not limited to, data (e.g., packet) buffering, video processing, data communications, shared memory switching, shared link tables, etc. Multi-port memory, unlike its single-port memory counterpart, is generally characterized by its ability to read data from or write data to the memory on one port while simultaneously reading a second piece of data from or writing a second piece of data to the memory on another port. Hence, each port provides a separate independent read and write access path for reading data from the memory or writing new data into the memory. One embodiment of a multi-port memory is a four-port memory, such as a two-port read, two-port write (2R2W) memory, which has dedicated read and write ports.

Multi-port memory is typically implemented using static random access memory (SRAM). In a conventional single-port architecture, each bit in an SRAM cell is stored using four transistors that form two cross-coupled inverters operative as a storage element of the memory cell. Two additional transistors serve to control access to the storage element during read and write operations. A typical SRAM cell uses six transistors and is thus often referred to as a 6T SRAM. In a multi-port architecture, two additional access transistors are generally used for each additional port; hence two-port functionality would be provided by an eight-transistor (8T) SRAM, three-port functionality would be provided by a ten-transistor (10T) SRAM, and so on. A direct implementation of a two-port read, two-port write (2R2W) memory requires a four-port bit cell as well as four corresponding word lines and four corresponding bit lines, resulting in large area consumption, high power consumption, and likely slower performance compared to a single-port memory having the same storage capacity. Because implementing a true monolithic multi-port memory can consume a significant amount of area and power on an integrated circuit (IC) chip, there have been various proposed memory architectures which employ single-port memory cells, often referred to as single port read/write (1RW) memories, each having their own inherent disadvantages.

SUMMARY

Embodiments of the present invention advantageously utilize primarily single-port read/write (1RW) memory cells to emulate a multi-port memory functionality; namely, two-port read, two-port write (2R2W) memory emulation.

In accordance with an embodiment of the invention, a memory operative to provide concurrent two-port read and two-port write access functionality includes a memory array comprising first and second pluralities of single-port memory cells organized into a plurality of rows of memory banks, and multiple checksum modules. The second plurality of memory cells are operative as spare memory banks. Each of the checksum modules is associated with a corresponding one of the rows of memory banks. The memory further includes a first controller and multiple mapping tables. The first controller and at least a portion of the first and second pluralities of memory cells enable the memory array to support two-port read or single-port write operations. A second controller is operative to receive read and write access requests, and to map logical and spare memory bank identifiers to corresponding physical memory bank identifiers via the mapping tables to thereby emulate concurrent two-port read and two-port write access functionality in the memory.

Embodiments of the invention will become apparent from the following detailed description thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Embodiments of the invention will be described herein in the context of illustrative two-port read, two-port write (2R2W) memory circuits implemented using primarily single-port (1RW) memory cells. It should be understood, however, that embodiments of the invention are not limited to these or any other particular circuit configurations. Rather, embodiments of the invention are more broadly related to techniques for implementing a multi-port memory using a plurality of single-port memory cells in such a way that conflicts between concurrent read accesses and write accesses associated with the memory are resolved with fixed latency. A multi-port read, multi-port write memory implemented using a plurality of single-port memories or a plurality multi-port memories with a fewer number of ports than that of a multi-port memory being implemented in accordance with embodiments of the invention advantageously provides enhanced performance, reduced power consumption and reduced chip area, among other benefits, compared to a true (monolithic) multi-port memory cell implementation. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

As a preliminary matter, for the purposes of clarifying and describing embodiments of the invention, the following table provides a summary of certain acronyms and their corresponding definitions, as the terms are used herein:

Table of Acronym Definitions

| Acronym | Definition |
| --- | --- |
| 1R1W | Single-port read, single-port write |
| 2R2W | Two-port read, two-port write |
| 1RW | Single-port read/write |
| 2RW | Two-port read/write |
| 2Ror1W | Two-port read or single-port write |
| 4R1W | Four-port read, single-port write |
| 4R2W | Four-port read, two-port write |
| 2R2RW | Two-port read, two-port read/write |
| SRAM | Static random access memory |
| RE | Read enable |
| WE | Write enable |
| IC | Integrated circuit |

Figure 1:
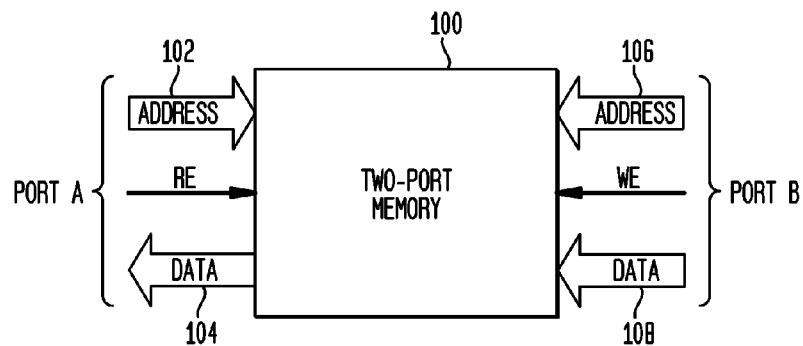
FIG. 1 is a block diagram conceptually illustrating an exemplary two-port memory and corresponding control signals for accessing the memory.

FIG. 1 is a block diagram conceptually illustrating an exemplary two-port memory 100 and corresponding control signals for accessing the memory. Memory 100 preferably includes a first port (Port A), which in this embodiment is a read port, having a first address bus 102 operative to convey a read address, a first data bus 104 operative to convey data read from the memory, and a read enable (RE) control signal, all associated with the first port. Likewise, memory 100 includes a second port (Port B), which in this embodiment is a write port, having a second address bus 106 operative to convey a write address, a second data bus 108 operative to convey data to be written to the memory, and a write enable (WE) control signal, all associated with the second port.

Figure 2:
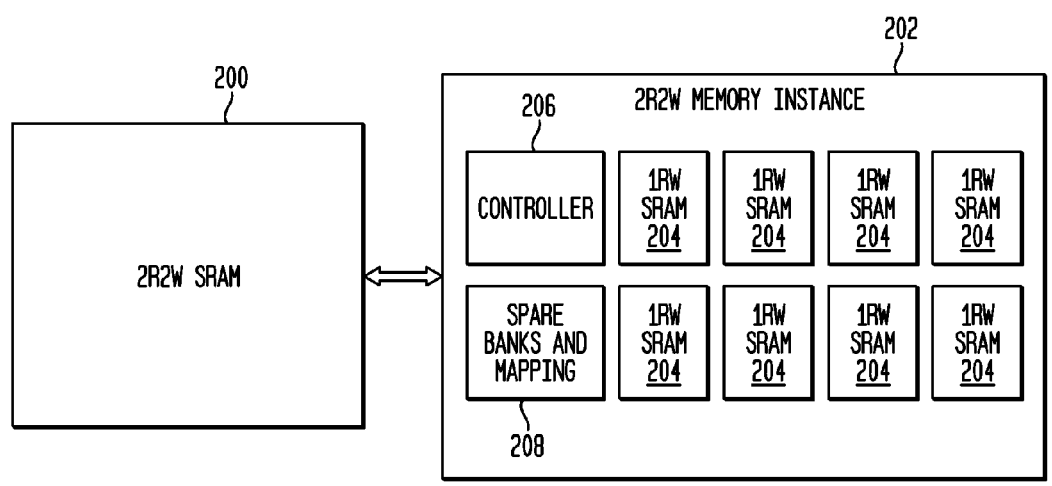
FIG. 2 is a block diagram conceptually illustrating a correspondence between a monolithic 2R2W memory and an exemplary equivalent implementation of a 2R2W memory which employs a plurality of single-port memory banks (e.g., 1RW SRAM), according to an embodiment of the invention.

Disadvantages of using a monolithic multi-port memory include, but are not limited to, degraded performance (e.g., lower speed), increased chip area and increased power consumption, as previously stated. Embodiments of the invention address one or more problems associated with conventional multi-port memory architectures by utilizing primarily single-port (1RW) memory cells to implement a multi-port memory (e.g., 2R2W memory). With reference to FIG. 2, a block diagram conceptually illustrates a correspondence between a monolithic 2R2W memory 200 and an exemplary equivalent implementation of a 2R2W memory 202 which employs a plurality of single-port memory banks 204 (e.g., 1RW SRAM), according to an embodiment of the invention. Memory 202 further includes a controller 206 and spare memory banks and mapping circuitry 208, which enables support for two simultaneous reads and two simultaneous writes through adding spare memory banks and memory address mapping. Further details of the illustrative memory 202 will be described herein below.

Although embodiments of the invention may be shown with specific reference to an illustrative 2R2W (four-port) memory implementation, merely for simplicity and economy of description, it is to be appreciated that embodiments of the invention are not limited to four-port memory. Rather, embodiments of the invention may be extended to construct a memory having essentially any number of ports (i.e., multi-port memory in general). Moreover, according to embodiments of the invention, a higher port count multi-port memory can be constructed from a lower port count multi-port memory, as will become apparent to those skilled in the art given the teachings herein.

Figure 3:
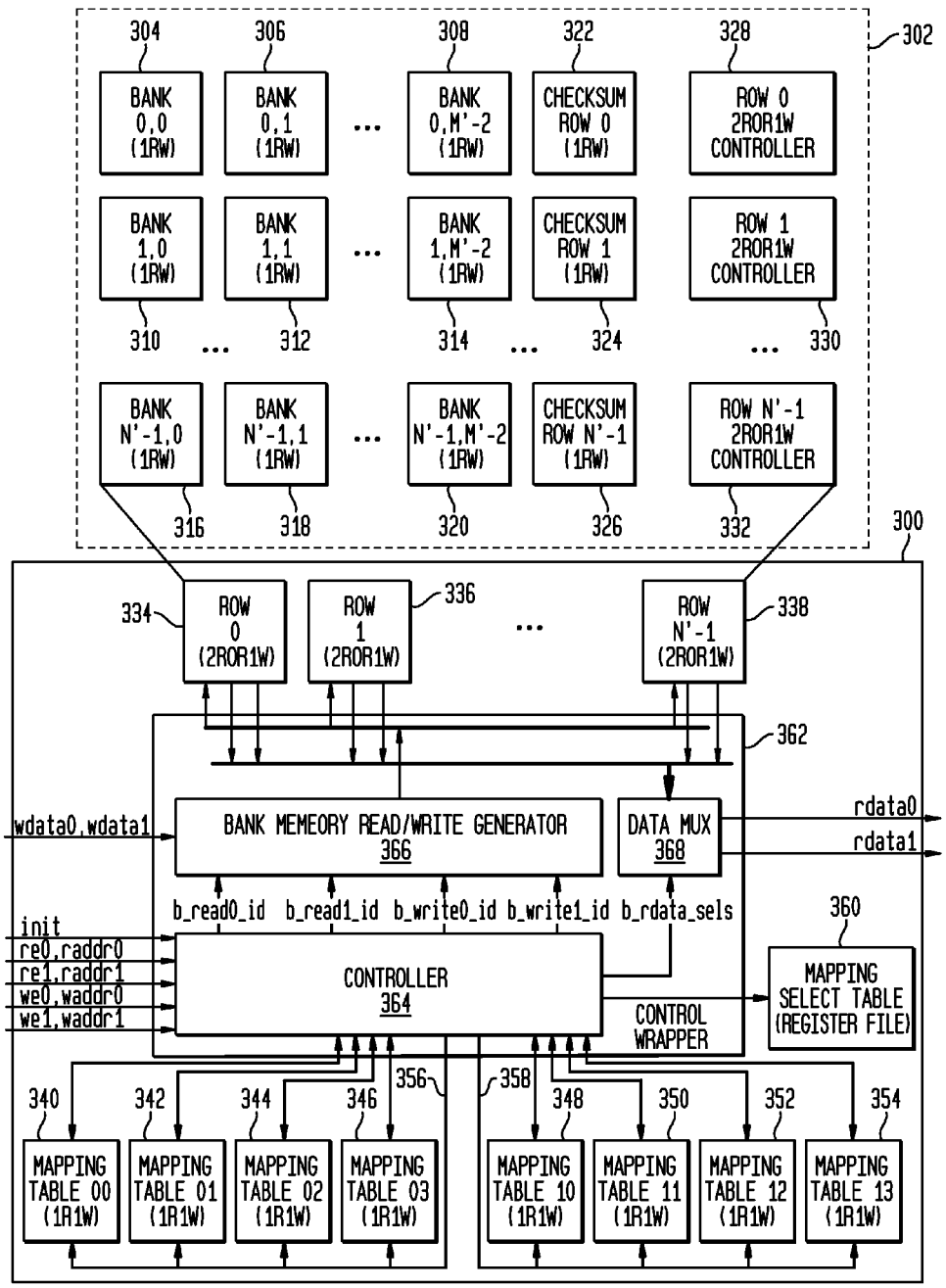
FIG. 3 is a block diagram depicting at least a portion of an exemplary pseudo-synchronous multi-port (e.g., 2R2W) memory comprising primarily single-port memory modules, according to an embodiment of the invention.

FIG. 3 is a block diagram depicting at least a portion of an exemplary pseudo-synchronous multi-port (e.g., 2R2W) memory 300 comprising primarily single-port (e.g., 1RW) memory modules, according to an embodiment of the invention. Multi-port memory 300 emulates a monolithic 2R2W memory by dividing the memory space in a depth direction into K (where K is an integer) equal depth memory banks, and each memory bank is replaced with single-port (1RW) memory. In alternative embodiments, the memory banks need not be of equal depth but can vary in depth. However, a mapping table depth corresponding to the memory banks should have a depth equal to or greater than a maximum depth of any given one of the memory banks. Memory 300 includes a plurality of 1RW memory modules or banks organized into an array 302 of N rows by M columns (i.e., an N×M array), where N and M are integers and where N×M is greater than or equal to K. Due to rounding, not every row necessarily includes M banks of 1RW memory.

Furthermore, array 302 includes 3M additional banks of 1RW memory operative as spare memory (3M banks are preferred to handle a corner case), which are incorporated, in this embodiment, into one or more of memory banks 304 through 320. A higher number of spare memory banks may be used according to other embodiments; 2Ror1W is a limiting factor in this example. Read requests are given priority, according to the illustrative embodiment. If there is a conflict between read and write accesses in a given memory cycle, a spare bank is written instead of the bank being read and the mapping table is updated accordingly to reflect the change. In accordance with embodiments of the invention, a spare bank is dynamically assigned rather than fixed. After writing to a spare location, the original targeted memory bank becomes a spare bank for that particular write bank offset. Each write bank offset has a unique set of spare banks.

There is a total of K+3M 1RW memory banks in array 302, which is arranged into N' rows (0 to N'−1) by M columns, where N'×M is greater than or equal to K+3M. It is to be appreciated that the spare memory may, in other embodiments, reside external to the memory array 302. M additional banks of 1RW memory are included as a checksum for each row, thus forming a new array of N'×M', where M' is equal to M+1. With this configuration, each row is capable of operating as a pseudo two-port read or single-port write (2Ror1W) memory, where read and write operations are exclusive during any given memory cycle.

More particularly, array 302 comprises N' rows (0 to N'−1) and M' columns (columns 0 to M'−2 plus a checksum column), wherein row 0 includes 1RW memory banks 304, 306, through 308, and checksum 322, also implemented in this embodiment using 1RW memory, row 1 includes memory banks 310, 312, through 314, and checksum 324, and row N'−1 includes memory banks 316, 318, through 320, and checksum 326. The term "memory bank," which may be used herein synonymously with "memory module," is intended to refer broadly to essentially any organized grouping of storage elements. It is to be understood that most of the rows in array 302 have M banks of single-port (1RW) memory and a checksum 1RW memory, but one or more rows, in certain embodiments, may have less than M banks of 1RW memory due to rounding, as previously stated.

Each of the rows, 0, 1, through N'−1, of memory banks in array 302 includes a controller, 328, 330, through 332, respectively, associated therewith which is operative to facilitate two simultaneous reads or one write (i.e., 2Ror1W) operation. The controllers 328, 330 and 332, collectively, form at least a portion of a larger controller operative to enable the memory array 302 to perform multi-port read or single-port write operation. Each row of memory banks, checksum and controller are represented by a corresponding 2Ror1W memory block in the memory 300. For example, row 0, which includes memory banks 302, 304, through 308, checksum 322 and controller 328, is represented in memory 300 as memory block 334, row 1, which includes memory banks 310, 312, through 314, checksum 324 and controller 330, is represented as memory block 336, and row N'−1, which includes memory banks 316, 318, through 320, checksum 326 and controller 332, is represented as memory block 338.

Memory 300 includes two sets of mapping tables, each mapping table being implemented using 1R1W memory. In this embodiment, each set of mapping tables includes four 1R1W memory banks, although embodiments of the invention are not limited to any specific number of memory banks in a given set of mapping tables. Specifically, a first set of mapping tables comprises a first mapping table (00) 340, a second mapping table (01) 342, a third mapping table (02) 344, and a fourth mapping table (03) 346. A second set of mapping tables comprises a fifth mapping table (10) 348, a sixth mapping table (11) 350, a seventh mapping table (12) 352, and an eighth mapping table (13) 354. The first set of mapping tables is adapted to receive a first common write data line 356, and each of the respective mapping tables 340, 342, 344, 346 forming the first set has an individual read data line corresponding thereto. Likewise, the second set of mapping tables is adapted to receive a second common write data line 358, and each of the respective mapping tables 348, 350, 352, 354 forming the second set has an individual read data line corresponding thereto. In this manner, each set of mapping tables collectively functions as a four-port read, single-port write (4R1W) memory.

The eight banks of 1R1W memory 340, 342, 344, 346, 348, 350, 352 and 354 forming the two sets of mapping tables has the same depths as the 1RW memory forming the array 302 and has a width of roundup[log 2(K+3M)]·(K+3M). Here, the roundup function is operative to round up a fractional number to the next biggest integer number and a log 2 function is a base 2 logarithm function.

A mapping select module 360 and control logic 362 are included in memory 300. The control logic 362, which includes a controller 364, a bank memory read/write signal generator 366 coupled with the controller and a data multiplexer (MUX) 368 coupled with the controller 364, is operative to emulate the 2R2W functionality in memory 300. The mapping select module 360, in this embodiment, is implemented as a table which comprises a four-port read, two-port write (4W2R) memory using one or more registers and/or a register file. The mapping select module 360 has the same depth as the 1RW memory banks in array 302 and has a width of one bit. A bit at each given offset generated by the control logic 362 indicates which set of mapping tables is valid at the given offset.

An embodiment that uses a mapping select table and two sets of 4R1W mapping tables will emulate a 4R2W mapping table function. In the case of a write update, there are at most two simultaneous writes, but each mapping table can only support one write per cycle. Therefore, one of the write accesses will be directed to one mapping table and the other write access will be directed to the other mapping table during the same cycle, unless the two writes are going to the same offset, in which case the two writes will be combined to one write instead. The mapping select table will then be updated to indicate which mapping table has the latest mapping information for each offset. When the mapping table is read back, the mapping select table will be read too in order to retrieve the latest mapping information.

By way of example only and without loss of generality, an illustrative operation of the memory 300 will now be described with reference to FIG. 3, according to an embodiment of the invention. For each incoming read or write access request to the memory 300, a logical bank identifier (e.g., b_read0_id, b_read1_id, b_write0_id, and b_write1_id signals) and an offset within the bank are determined, as generated by controller 364. A read access request for reading the memory 300 may be initiated through one or more signals supplied to the control logic 362 (e.g., controller 364) in memory 300, including at least one of an initiate (init) signal, a first read enable (re0) signal, a second read enable (re1) signal, a first read address (raddr0), and a second read address (raddr1). The init signal will trigger a state machine or other controller (not explicitly shown) to initialize mapping table memory. In other embodiments, the init signal may also initialize the mapping select table, depending on the design of memory 300 or the application in which the memory 300 is used. Read data signals, rdata0 and rdata1, indicative of the data read from the memory array 302 at address locations raddr0 and raddr1, respectively, are generated as output signals by the data multiplexer (MUX) 368. Data multiplexer 368 is operative to multiplex respective read data outputs from all 2Ror1W rows 334, 336 through 338, and to select a corresponding pair of 2Ror1W rows as the 2R2W outputs rdata0 and rdata1 as a function of select control signal b_data_ sels generated by the controller 364. The two reads may originate from a single 2Ror1W row.

Likewise, a write access may be initiated by one or more signals supplied to the control logic 362, including at least one of a first write enable (we0) signal, a second write enable (we1) signal, a first write address (waddr0), and a second write address (waddr1). Write data signals, wdata0 and wdata1, indicative of the data to be written to the memory array 302 at address locations waddr0 and waddr1, respectively, are received as input signals by the bank memory read/write signal generator 366. The bank memory read/write signal generator 366 is operative to generate read and write signals for each of the 2Ror1W rows 334, 336 through 338 as a function of read and write logical bank identifiers (e.g., b_read0_id, b_read1_id, b_write0_id, and b_write1_id signals) received from the controller 364. The read and write logical bank identifiers are at least part of a conflict resolution functionality of the controller 364.

Using the bank offset generated by the control logic 362 (in particular, the controller 364), the mapping select module 360 determines which one of the mapping tables 340 through 354 is valid at this offset. For a read access, a physical bank identifier associated with the incoming read accesses is determined. Read data can be uniquely allocated using the physical bank identifier and offset. For a write access, the associated physical bank identifier and available spare bank physical identifiers are determined. Both the physical bank identifier and spare bank identifiers are associated with a write. The other write, in the simultaneous dual-write scenario, has both a different physical bank identifier and spare bank identifiers. With knowledge of all four physical banks, for the two read accesses, if there is no read physical bank conflict, the two reads will be performed directly at the physical memory locations corresponding to the supplied read address (raddr0, raddr1). If the two read accesses are within the same physical bank, a two-read operation will be performed on the row where the physical bank resides in the N'×M' array 302.

Specifically, one read data access comes from the physical bank at its associated offset, and the other read data access comes from calculation. Specifically, the second read to the same bank involves reading all memories including the check sum memory, except the memory occupied by the first read at the offset associated with the second read, and then performing an exclusive-OR (XOR) function with data from all the memories that are read for the second read access. It is to be appreciated that the calculation relating to the second read access is not required to be based on an XOR function. Rather, such second read access can be based on an alternative calculation. For instance, the calculation could be checksum=bank0±bank1+bank2, or checksum=bank0−bank1−bank2, etc., according to embodiments of the invention. An XOR function is simply one illustrative methodology. The function of the mapping table is to map a logical bank identifier to a physical bank identifier. In this embodiment, the logical bank identifier is from 0 to K−1 and the physical bank identifier is from 0 to K+(3M−1). Access conflicts are checked and resolved at the physical level, and then the corresponding mapping table is updated to reflect the new logical-to-physical mapping.

In the case of two write accesses, if any memory in a row where the intended physical bank of a write resides is also accessed by another operation, regardless of whether it is a read or write access, a write bank conflict is marked. A conflict resolution operation is then performed whereby a spare memory bank that does not induce a write bank conflict is determined. In this embodiment, each of the write accesses has 3M spare banks to select from. A final selection of the two write physical banks should not be in the same row as any read or write physical bank in the array 302.

As an explanation as to why each of the write accesses has 3M spare banks to select from in this embodiment, assume that there are 3M−1 spare banks. An illustrative worst-case scenario is as follows:

1. Two reads go to two rows, row A and row B;
2. Two writes have two sets of spare banks, SB_A and SB_B;
3. Two writes target a same bank, W, on a third row C (i.e., multiple write conflict);
4. The spare bank sets SB_A and SB_B are identical, referred to as SB;
5. SB contains all banks in row A and row B as well as all banks in row C, except bank W;
6. Due to 2Ror1W limitation, none of the spare banks on row A or row B can be used for a write since there is one read on the two rows;
7. Bank W is used by one of the writes, which means no other banks in row C can be used for a write. Hence, there are no options available for the second write. However, if there is one more spare bank, 3M instead of 3M−1, it is guaranteed that there is a spare bank on a different row, D, other than rows A, B or C. In this case, row D is available for a second write. In other words, there are 3M spare banks plus a target bank for write; two reads and the other write can prohibit access to at most 3M banks. Thus, there will be one available bank for a write in any case.

Once the write conflict, if any, has been resolved, a 2Ror1W-type of write/update is performed. The 2Ror1W write would write data to an intended bank in a given row in array 302 and would update an associated checksum, such as through reading the remaining memory banks (except the checksum memory) in the given row and computing a new value corresponding thereto. Writing the updated checksum to the associated checksum memory can be performed concurrently with the data write or, alternatively, may be performed one or more cycles later, such as when another write to the row occurs in order to get pipeline cycles working properly.

When a spare bank is used to resolve a write conflict, the mapping table corresponding thereto is updated to reflect the new map. There could be as many as two updates to the mapping table for each cycle resulting from the two writes. If the two updates are at different offsets, one update will go to one set of mapping tables (e.g., mapping tables 340 through 346) and the other update will go to the other set of mapping tables (e.g., mapping tables 348 through 354). Otherwise, the two updates will be merged first before it is written to update either set of the mapping tables. The mapping select module 360 will also be updated to reflect which set of tables contains the latest mapping information.

In accordance with an alternative embodiment, each of the columns in array 302, except the checksum column, can be viewed as a two-port read, two-port read/write (2R2RW) memory with some limitations. By way of example only and without loss of generality, each column is constructed with N' memories (N data memories and three spare memories), which have the following characteristics:

1. Supports up to four reads on four different banks;
2. Supports up to two writes;
3. At most four combined read and write accesses at any cycle;
4. Ability to mark a bank as occupied by read without actually performing the read;
5. The 2R2RW memory is managed by a mapping table with a capacity of round($\log_2$(N'))·N'. The mapping table stores a physical identifier (ID) within the 2R2RW memory, from 0 to N'−1.
6. Overall mapping table storage for 2R2W memory 300, if it were implemented using four-port read, two-port write (4R2W) memory, is roundup($\log_2$(N'))·N'·(M'−1).

One conflict resolution methodology for this embodiment is as follows:

1. Logical_ID is further broken down to column_ID and sub_logical_ID within a column. Conflict resolution occurs within the column where memory access is targeted.
2. If a row in memory 300 is accessed (read or write), all banks on this row are marked as read or occupied by read without actually performing the read. In other words, each access occupies a memory bank on each of the 2R2RW column.
3. Read is given priority;
4. If a first write targets a bank on this column, it cannot write to the banks in at most two rows being read or marked as being read. If a conflict occurs, three spare banks can be chosen, out of which at least two are available for a write;
5. If a second write targets a bank on this column, it cannot write to the banks in at most three rows either being read or written. If a conflict occurs, three spare banks can be chosen, out of which at least one is available for a write.

According to illustrative embodiments of the invention described herein, a two-port read, two-port write memory can be fabricated using single-port memory cells. It is to be appreciated, however, that memory supporting an even higher number of read and write ports can be similarly fashioned using multi-port memory cells, rather than single-port memory cells, according to other embodiments of the invention, as will become apparent to those skilled in the art given the teachings herein.

At least a portion of the embodiments of the invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of embodiments of the invention.

An integrated circuit in accordance with embodiments of the invention can be employed in essentially any application and/or electronic system in which multi-port memories are utilized (e.g., two-port SRAM, two-port eDRAM, etc.). Suitable applications and systems for implementing techniques according to embodiments of the invention may include, but are not limited, to interface devices (e.g., interface networks, high-speed memory interfaces (e.g., DDR3, DDR4), etc.), personal computers, communication networks, electronic instruments (e.g., automated test equipment (ATE), measurement equipment, etc.), etc. Systems incorporating such integrated circuits are considered part of embodiments of the invention. Given the teachings of embodiments of the invention provided herein, one of ordinary skill in the art will be able to contemplate other implementations and applications of the techniques of embodiments of the invention.

Furthermore, one or more embodiments of the invention or elements thereof can be implemented in the form of an apparatus including a memory and at least one processor that is coupled with the memory and operative to perform, or facilitate the performance of, exemplary method steps for emulating concurrent two-port read and two-port write access functionality in a memory. As used herein, "facilitating" an action includes performing the action, making the action easier, helping to carry out the action, or causing the action to be performed. Thus, by way of example only and without limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Yet further, in another aspect, one or more embodiments of the invention or elements thereof can be implemented in the form of means for carrying out one or more of the memory emulation techniques described herein; the means can include (i) hardware module(s), (ii) software module(s) executing on one or more hardware processors, or (iii) a combination of hardware and software modules; any of (i)-(iii) implement the specific techniques set forth herein, and software modules relating to embodiments of the invention are stored in a tangible computer-readable recordable storage medium (or multiple such media). Appropriate interconnections via bus, network, and the like can also be included.

The embodiments of the invention described herein are intended to provide a general understanding of the various embodiments, and are not intended to serve as a complete description of all the elements and features of apparatus and systems that might make use of the structures described herein. Other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other embodiments of the invention. Although embodiments of the invention have been described herein with reference to the accompanying drawings, it is to be understood that embodiments of the invention are not limited to the described embodiments, and that various other embodiments within the scope of the following claims will be apparent to those skilled in the art given the teachings herein.

What is claimed is:

1. A memory operative to provide concurrent two-port read and two-port write access functionality, the memory comprising:
  a memory array, the memory array comprising a first plurality of single-port memory cells, a second plurality of single-port memory cells operative as spare memory banks, and a plurality of checksum modules, the first and second pluralities of single-port memory cells being organized into a plurality of rows of memory banks, each of the plurality of checksum modules being associated with a corresponding one of the plurality of rows of memory banks;
  a first controller coupled with the memory array, the first controller and at least a subset of the first and second pluralities of single-port memory cells being operative to enable the memory array to support two-port read or single-port write operations;
  a plurality of mapping tables; and
  a second controller operative to receive read and write access requests supplied to the memory, and to map a logical memory bank identifier and a spare memory bank identifier to corresponding physical memory bank identifiers via the mapping tables for resolving access conflicts in the memory to thereby emulate concurrent two-port read and two-port write access functionality in the memory.

2. The memory of claim 1, wherein the first controller comprises a plurality of row controllers, each of the plurality of row controllers being associated with a corresponding one of the plurality of rows of memory banks in the memory array and being configured to facilitate two simultaneous reads or one write operation in the corresponding one of the plurality of rows of memory banks.

3. The memory of claim 1, wherein the second controller comprises:
  a control module operative to receive at least one of read access requests and write access requests supplied to the memory, and to generate, for each incoming read or write access request, a physical bank identifier and an offset within a corresponding physical memory bank associated with the physical bank identifier;

a bank memory read/write generator coupled with the control module and operative to select at least one of the plurality of single-port memory cells in a given one of the plurality of rows of memory banks as a function of at least one of the physical bank identifier and offset; and a data multiplexer coupled with the control module and operative to generate at least one read data output signal.

4. The memory of claim 3, wherein the bank memory read/write signal generator is operative to generate read and write signals for each of the plurality of rows of memory banks in the memory array as a function of physical bank identifiers generated by the control module.

5. The memory of claim 3, wherein the data multiplexer is operative to multiplex respective read data outputs from all of the plurality of rows of memory banks, and to select a corresponding subset of rows as the multi-port read, multi-port write outputs of the memory as a function of at least one select control signal generated by the control module.

6. The memory of claim 1, wherein the plurality of mapping tables is organized into at least two sets of mapping tables, at least a subset of each set of mapping tables comprising a plurality of single-port read, single-port write memory banks.

7. The memory of claim 6, further comprising a mapping select module operative to select a given one of the sets of mapping tables as a function of at least one of the read and write access requests.

8. The memory of claim 7, wherein the mapping select module is configured having a depth at least equal to a depth of the plurality of memory banks in the memory array and having a width of one bit.

9. The memory of claim 1, wherein the second controller and at least a given one of the second plurality of single-port memory cells are operative to resolve a memory access conflict during a given memory cycle and to generate a logical-to-physical mapping corresponding thereto, and at least a given one of the mapping tables is updated to store the logical-to-physical mapping.

10. The memory of claim 9, wherein the second controller and at least a given one of the second plurality of single-port memory cells are further operative to remap at least one of a plurality of write access requests to resolve at least one of a read and write conflict and a two-write conflict of at least one of the first and second pluralities of single-port memory cells in the memory array.

11. The memory of claim 1, wherein the plurality of mapping tables is organized into two sets of mapping tables, each of the mapping tables comprising a single-port read, single-port write memory bank, the memory being configured to support two-port read, two-port write functionality.

12. The memory of claim 1, wherein the memory array is organized into a plurality of rows and columns of memory banks, at least one of the columns comprising the plurality of checksum modules, each of the plurality of checksum modules being associated with a corresponding one of the plurality of rows of memory banks.

13. The memory of claim 12, wherein each of at least a subset of the plurality of columns comprises a plurality of data memory banks and three spare memory banks, the memory array being configured to simultaneously support up to four memory accesses to four different memory banks so as to emulate simultaneous two-port read, two-port read/write functionality in the memory, the second controller being operative to mark a memory bank as occupied by read without actually performing the read, the two-port read, two-port read/write functionality being controlled by at least one of the plurality of mapping tables, the at least one mapping table storing a physical identifier within the memory.

14. The memory of claim 12, wherein the second controller is operative to perform conflict resolution by assigning a column identifier and a sub-logical identifier within a corresponding column to the physical memory bank identifier, the conflict resolution occurring within a column where memory access is targeted as a function of the column identifier and the sub-logical identifier.

15. The memory of claim 14, wherein when a given row in the memory is accessed, the second controller is further operative to mark all memory banks in the given row as read or occupied by read without a necessity of performing a read operation, so that each access occupies a memory bank in each of the plurality of columns, and wherein a read operation is given priority.

16. The memory of claim 1, wherein at least a portion of the memory is embedded in at least one integrated circuit.

17. An electronic system for providing concurrent two-port read and two-port write access functionality, the system comprising at least one memory, the at least one memory comprising:

a memory array, the memory array comprising a first plurality of single-port memory cells, a second plurality of single-port memory cells operative as spare memory banks, and a plurality of checksum modules, the first and second pluralities of single-port memory cells being organized into a plurality of rows of memory banks, each of the plurality of checksum modules being associated with a corresponding one of the plurality of rows of memory banks;

a first controller coupled with the memory array, the first controller and at least a subset of the first and second pluralities of single-port memory cells being operative to enable the memory array to support two-port read or single-port write operations;

a plurality of mapping tables; and a second controller operative to receive read and write access requests supplied to the memory, and to map a logical memory bank identifier and a spare memory bank identifier to corresponding physical memory bank identifiers via the mapping tables for resolving access conflicts in the memory to thereby emulate concurrent two-port read and two-port write access functionality in the memory.

18. The system of claim 17, wherein the second controller comprises:

a control module operative to receive at least one of read access requests and write access requests supplied to the memory, and to generate, for each incoming read or write access request, a physical bank identifier and an offset within a corresponding physical memory bank associated with the physical bank identifier;

a bank memory read/write generator coupled with the control module and operative to select at least one of the plurality of single-port memory cells in a given one of the plurality of rows of memory banks as a function of at least one of the physical bank identifier and offset; and a data multiplexer coupled with the control module and operative to generate at least one read data output signal.

19. The system of claim 18, wherein the data multiplexer is operative to multiplex respective read data outputs from all of the plurality of rows of memory banks, and to select a corresponding subset of rows as the multi-port read, multi-port write outputs of the memory as a function of at least one select control signal generated by the control module.

20. The system of claim 17, wherein the second controller and at least a given one of the second plurality of single-port memory cells are operative to resolve a memory access conflict during a given memory cycle and to generate a logical-to-physical mapping corresponding thereto, and at least a given one of the mapping tables is updated to store the logical-to-physical mapping.

* * * * *